United States Patent
Sugimoto et al.

(10) Patent No.: US 8,451,010 B2
(45) Date of Patent: May 28, 2013

(54) COUPON BOARD AND MANUFACTURING METHOD OF PRINTED BOARD

(75) Inventors: Kaoru Sugimoto, Kawasaki (JP); Katsuhiko Kobayashi, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 350 days.

(21) Appl. No.: 12/828,776

(22) Filed: Jul. 1, 2010

(65) Prior Publication Data

US 2011/0018552 A1   Jan. 27, 2011

(30) Foreign Application Priority Data

Jul. 27, 2009   (JP) .................. 2009-174570

(51) Int. Cl.
*H01H 31/02*   (2006.01)

(52) U.S. Cl.
USPC ............. 324/555; 29/883; 428/113; 428/131; 174/250; 174/257

(58) Field of Classification Search
USPC ............................................ 324/555; 29/833
See application file for complete search history.

(56) References Cited

U.S. PATENT DOCUMENTS

| | | | | |
|---|---|---|---|---|
| 3,992,772 A * | 11/1976 | Scannell et al. | ................ | 29/833 |
| 4,656,314 A * | 4/1987 | Durand | .......................... | 174/257 |
| 6,114,634 A * | 9/2000 | Dittmer | .......................... | 174/255 |
| 6,115,910 A * | 9/2000 | Ghahghahi | ..................... | 29/833 |
| 6,467,162 B2 * | 10/2002 | Takigami | ........................ | 29/833 |
| 6,550,135 B2 * | 4/2003 | Nakahara et al. | ................ | 29/833 |
| 6,667,090 B2 * | 12/2003 | Boggs et al. | ................... | 428/131 |
| 6,670,816 B2 * | 12/2003 | Kim et al. | ...................... | 324/535 |
| 6,754,551 B1 * | 6/2004 | Zohar et al. | .................... | 700/121 |
| 7,313,862 B2 * | 1/2008 | Takahashi | ........................ | 29/833 |
| 7,339,646 B2 * | 3/2008 | Izawa et al. | .................... | 349/150 |
| 7,583,513 B2 * | 9/2009 | Boggs et al. | ................... | 361/792 |
| 7,790,637 B2 * | 9/2010 | DiFonzo et al. | ................. | 442/50 |
| 7,843,057 B2 * | 11/2010 | Alger et al. | ..................... | 257/700 |
| 2002/0011857 A1 * | 1/2002 | Kawaguchi | .................... | 324/754 |
| 2002/0076522 A1 * | 6/2002 | Hsieh et al. | .................... | 428/113 |
| 2003/0056365 A1 * | 3/2003 | Boggs et al. | ................... | 29/825 |
| 2004/0131824 A1 * | 7/2004 | Hsieh et al. | .................... | 428/112 |
| 2004/0142154 A1 | 7/2004 | Tomekawa et al. | | |

(Continued)

FOREIGN PATENT DOCUMENTS

| | | | |
|---|---|---|---|
| EP | 272027 A2 * | 6/1988 | |
| JP | 61-042992 A | 3/1986 | |

(Continued)

OTHER PUBLICATIONS

European Search Report dated Nov. 24, 2010, issued in correspoding European Patent Application No. 10170538.2.

(Continued)

*Primary Examiner* — Melissa Koval
*Assistant Examiner* — Benjamin M Baldridge
(74) *Attorney, Agent, or Firm* — Westerman, Hattori, Daniels & Adrian, LLP (57) ABSTRACT

A coupon board is cut out together with a printed wiring board from a sheet material in which a solder resist film is formed on a surface of a glass cloth fiber. The coupon board is for evaluating characteristics of the printed wiring board. The coupon board includes a region on which the solder resist film is not formed, and which extends parallel with one side of the printed wiring board.

12 Claims, 5 Drawing Sheets

U.S. PATENT DOCUMENTS

| | | | |
|---|---|---|---|
| 2004/0195010 A1* | 10/2004 | Fielding | 177/154 |
| 2006/0050254 A1* | 3/2006 | Nakagawa et al. | 355/53 |
| 2006/0146261 A1* | 7/2006 | Izawa et al. | 349/149 |
| 2006/0207091 A1* | 9/2006 | Takahashi | 29/833 |
| 2007/0110388 A1* | 5/2007 | Alger et al. | 385/147 |
| 2007/0182436 A1* | 8/2007 | Freda et al. | 324/765 |
| 2007/0277375 A1* | 12/2007 | Takano et al. | 29/846 |
| 2008/0186687 A1* | 8/2008 | Lin et al. | 361/751 |
| 2008/0271314 A1* | 11/2008 | Chamberlin et al. | 29/846 |
| 2009/0159324 A1* | 6/2009 | Happoya et al. | 174/261 |
| 2009/0160474 A1* | 6/2009 | Koga | 324/763 |
| 2009/0191377 A1* | 7/2009 | Chuang | 428/107 |
| 2009/0266591 A1* | 10/2009 | Amou et al. | 174/258 |
| 2010/0093510 A1* | 4/2010 | Tanaka et al. | 501/32 |

FOREIGN PATENT DOCUMENTS

| | | | |
|---|---|---|---|
| JP | 61-047844 A | | 3/1986 |
| JP | 07-42159 U | | 7/1995 |
| JP | 09087400 A | * | 3/1997 |
| JP | 2002-164625 A | | 6/2002 |
| JP | 2004152874 A | * | 5/2004 |
| JP | 2010275404 A | * | 12/2010 |

OTHER PUBLICATIONS

Japanese Office Action mailed May 17, 2011, issued in corresponding Japanese Patent Application No. 2009-174570.

Taiwanese Office Action dated Oct. 24, 2012, issued in corresponding Taiwanese Patent Application No. 099122499, (10 pages). With English Translation.

* cited by examiner

COUPON BOARD AND MANUFACTURING METHOD OF PRINTED BOARD

CROSS-REFERENCE TO RELATED APPLICATION

This application is based upon and claims the benefit of priority of the prior Japanese Patent Application No. 2009-174570, filed on Jul. 27, 2009, the entire contents of which are incorporated herein by reference.

FIELD

The embodiment discussed herein is related to a coupon board for evaluating characteristics of a printed wiring board, and a manufacturing method of a printed board.

BACKGROUND

In some printed wiring boards, mesh fibers composed of warp fibers and weft fibers are embedded for suppressing extension and contraction due to temperature and humidity and for reinforcing strength. As the fibers to be embedded in the printed wiring boards, glass fibers are typically used.

In recent years, wiring on the printed wiring board has become denser, and the signals which are transmitted by the wiring have become higher-frequency signals. In accordance with this, higher characteristics have been required of printed wiring boards. When the characteristics of the printed wiring boards are to be further enhanced, the relation of the direction of the embedded fibers and the direction of the wiring becomes a problem, and it is known that the characteristics are more enhanced when these directions are slightly shifted from each other than when these directions correspond to each other. On printed wiring boards, wirings are generally printed parallel with one side of the printed wiring boards. Therefore, when such a printed wiring board having the directions of fibers and wirings shifted from each other is cut out from the sheet material with the fibers being embedded, which becomes a basis for cutting the printed wiring board, the printed wiring board is cut out so that the sides are formed, which are oblique with respect to the direction of extension of the fibers in the sheet material.

However, even if the printed wiring board which is completed by being cut out from the sheet material is observed, the orientation of the fibers may not be easily known because the fibers are embedded inside, and an opaque solder resist coating film for protection is formed on the printed wiring board surface.

Meanwhile, in order to guarantee the performance of printed wiring board which is completed, confirming the orientation of the embedded fibers is one of the important items.

Here, in order that a plating solution hardly penetrate to the wiring along the fibers embedded in the printed wiring board from the through-holes provided in the printed wiring board, it is proposed to make the direction of the embedded fibers and the direction of the wiring differ from each other.
Patent document 1: Japanese Laid-open Patent Publication No. S61-42992.
Patent document 2: Japanese Laid-open Patent Publication No. S61-47844.

SUMMARY

According to a first aspect of the invention, a coupon board is cut out together with a printed wiring board from a sheet material with a solder resist film formed on a surface of a glass cloth fiber, and is for evaluating characteristics of the printed wiring board.

According to the first aspect of the invention, a first coupon board has a region on which the solder resist film is not formed, and which extends parallel with one side of the printed wiring board.

According to the first aspect of the invention, a second coupon board has a region where the solder resist film is not formed on a surface, and which extends parallel with the fiber, and an angle table in which an angle indicating an angle with respect to a direction in which one side extends is printed.

In a manufacturing method of a printed wiring board according to a second aspect of the invention, a solder resist film is formed on a surface of a glass cloth fiber except for a part of a portion which is not a region for cutting a printed wiring board. In the manufacturing method of a printed wiring board disclosed in the present invention, from the glass cloth fiber, the printed wiring board is cut out, and in a region including a region where the solder resist film is not formed, a coupon board for evaluating characteristics of the printed wiring board is cut out.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Hereinafter, an embodiment of the present invention will be described with reference to the drawings.

Figure 1:
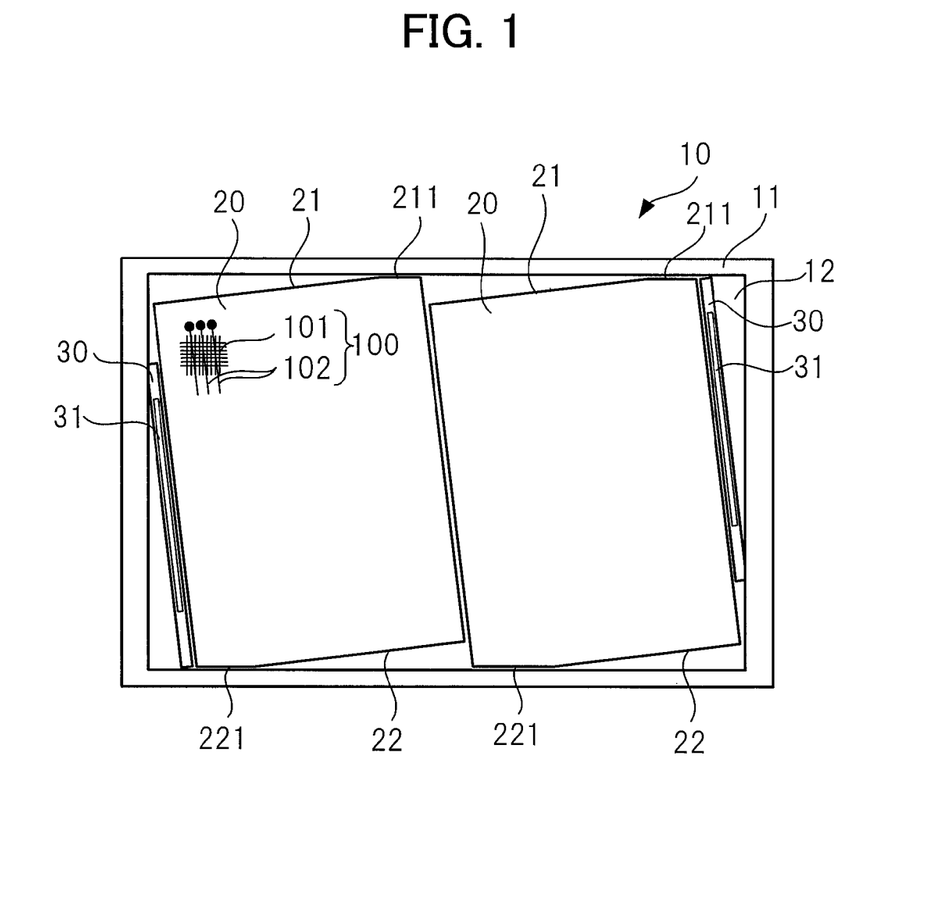
FIG. 1 is a view illustrating sheet materials to be a basis for cutting of printed wiring boards, and a layout of the boards which are cut out from the sheet materials.

FIG. 1 is a view illustrating a sheet material to be the basis of cutting of printed wiring boards, and a layout of the boards which are cut out from the sheet material.

A sheet material 10 illustrated in FIG. 1 is in a certain specified standard size. A band-shaped off-product area 11 which extends on the whole perimeter of the sheet material 10 is an area for handling the sheet material 10 in such a manner that, for example, the sheet material 10 and holes for positioning are formed, and is an area which may not be used as a product. A product area 12 which is inside from the off-product area 11 is a cuttable area as the printed wiring boards.

Glass fibers which vertically and laterally extend in a mesh shape are embedded in the sheet material 10.

FIG. 1 illustrates a mark 100 which is composed of a glass fiber 101 as a schematic view, which extends vertically and laterally, and a wiring 102 as a schematic view, which extends on a printed wiring board 20, for comprehensiveness.

The mark 100 is not drawn on the actual sheet material 10, but is illustrated for comprehensiveness in FIG. 1.

As illustrated in the mark 100, the glass fiber 101 extends in the directions parallel with and orthogonal to one side of the sheet material 10. Meanwhile, the wiring 102 on the printed wiring board 20 extends in the oblique direction when the sheet material 10 is set as the reference.

This is based on the knowledge that the electric characteristics may be enhanced by extending the wiring 102 obliquely with respect to the glass fibers 101.

In this case, in order to form the wiring 102 parallel with one side of the printed wiring board 20 on the printed wiring board 20, the printed wiring board 20 is obliquely cut out from the sheet material 10 as illustrated in FIG. 1. At the time of cutting of the printed wiring board 20, if an upper side 21 and a lower side 22 are to be linearly formed, parts of the upper side 21 and the lower side 22 extend off the product area 12, and therefore, the upper side 21 and the lower side 22 are cut into the shapes in which one portions 211 and 221 are cut off when seen from the printed wiring board 20 so as not to extend off the product area 12.

Further, FIG. 1 illustrates two printed wiring boards 20 which are cut out from one sheet material 10. Further, each coupon board 30 is illustrated beside each of the printed wiring boards 20. These coupon boards 30 are boards for evaluating various characteristics about the printed wiring boards 20. For the sheet material 10, a solder resist film as a protection film for preventing an alteration in quality of the wirings and the like formed on the surface of the sheet material 10 is formed on the surface of the sheet material 10 before cutting. The solder resist film at the spots where soldering is performed is removed. At the time of the removal, a window 31 with the solder resist film being removed, which is long in a longitudinal direction of the coupon board 30 is formed in the coupon board 30.

Figure 2:
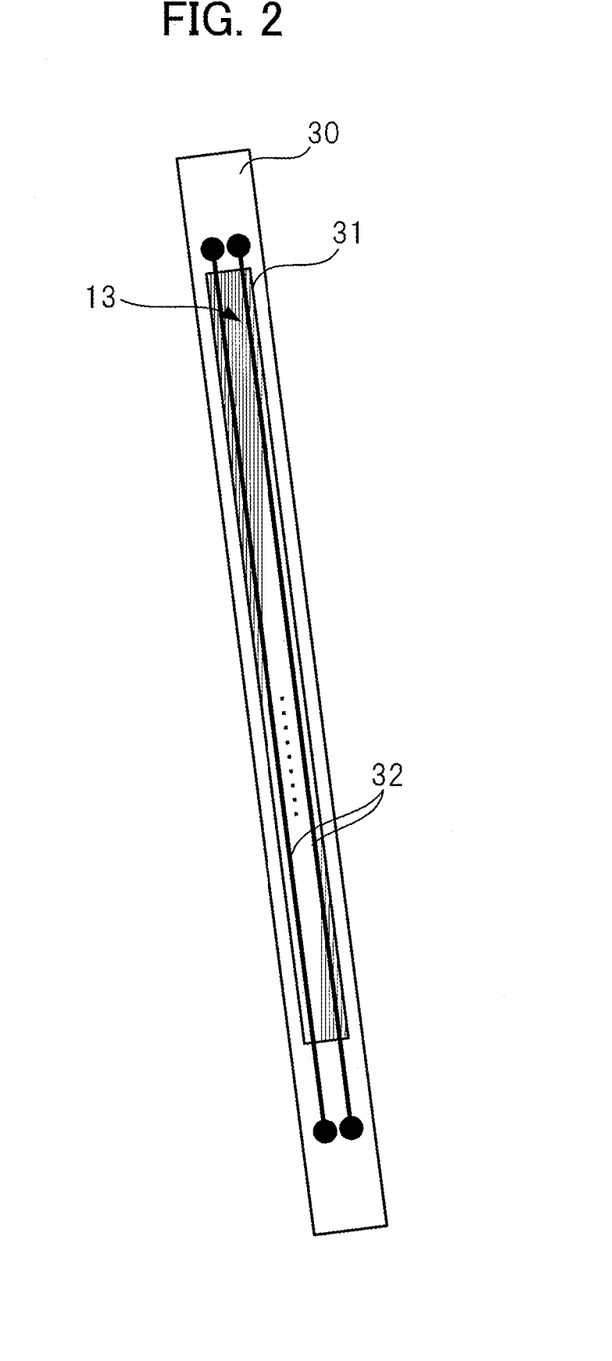
FIG. 2 is a view illustrating one coupon board.

FIG. 2 is a view illustrating one coupon board.

In the coupon board 30, a wiring 32 is formed parallel with a side in a longitudinal direction of the coupon board. The wiring 32 passes inside a window 31 in which the solder resist film is removed. The solder resist film is substantially opaque. In the window 31, the solder resist film is removed, and therefore, visual recognition is not hindered by the solder resist film. A base of the board in which the glass fibers are embedded is of an epoxy resin or the like and is translucent, and therefore, a glass fiber 13 which is embedded may be visually recognized in the inner side of the window 31.

The printed wiring board 20 and the coupon board 30 are cut out from a single sheet material 10. In addition, the arrangement position on the sheet material 10, of the printed wiring board 20 and the coupon board 30 is previously known. Therefore, the window 31 is formed in the coupon board 30, and the orientation of the glass fibers 13 is visually recognized in the coupon board 30 whereby, the orientation of the glass fibers embedded in the printed wiring board 20 which is paired with the coupon board 30 may be easily confirmed.

Figure 3:
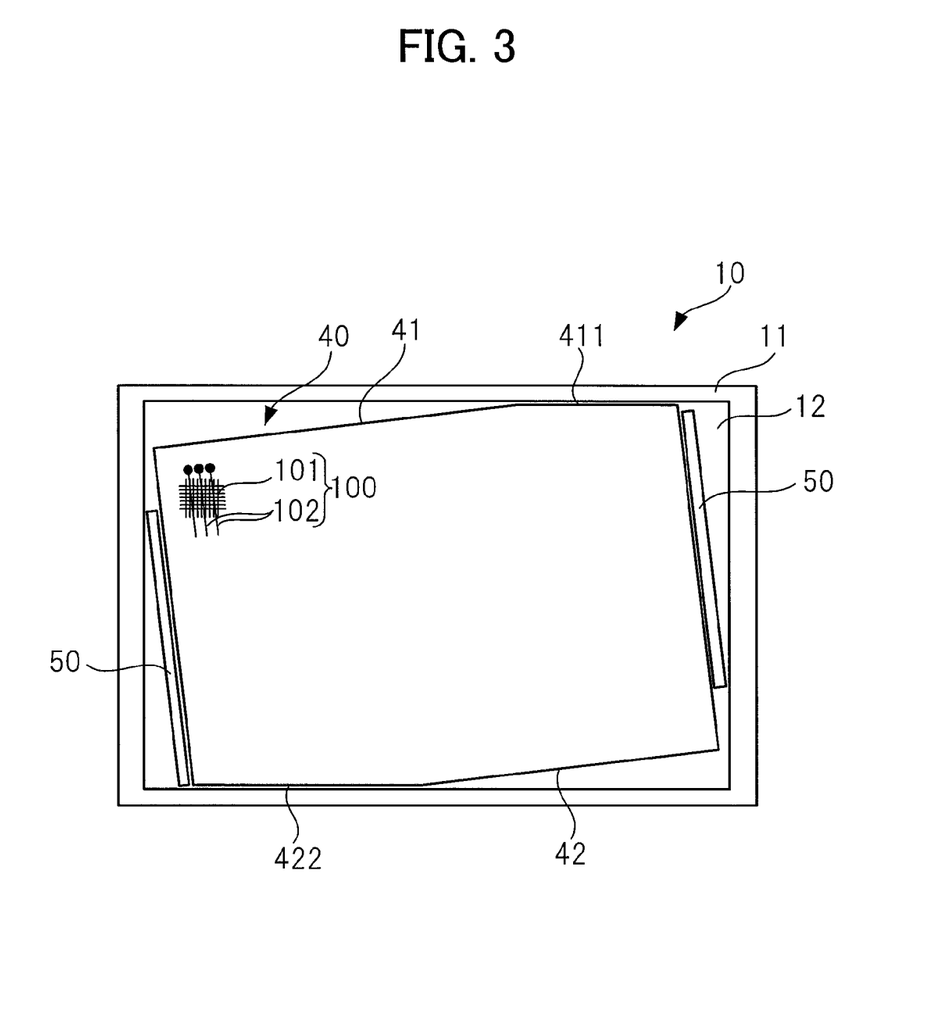
FIG. 3 is a view illustrating sheet materials to be a basis for cutting of printed wiring boards, and another layout of the boards which are cut out from the sheet materials as in FIG. 1.

FIG. 3 is a view illustrating a sheet material to be the basis of cutting of a printed wiring board, and a layout example of the board which is cut out from the sheet material.

In FIG. 3, the sheet material 10 is of the same sheet material as that in FIG. 1. The off-product area 11 surrounds the perimeter, and the product area 12 is provided inside thereof. Further, in FIG. 3, the mark 100 is similar to the case of FIG. 1, and the glass fiber 101 extends parallel with and perpendicularly to one side of the sheet material 10, and the wiring 102 extends obliquely.

FIG. 3 illustrates a printed wiring board 40 in a large size on the sheet material 10.

The printed wiring board 40 is cut out obliquely with respect to the sheet material 10 so that the wiring 102 becomes parallel with one side of the printed wiring board 40. At an upper side 41 and a lower side 42 of the printed wiring board 40, the printed wiring board 40 is cut out into a shape in which one portions 411 and 421 are cut along the edge of the product area 12 so as not to extend off the product area 12 of the sheet material 10. Each coupon board 50 for evaluating the characteristics of the printed wiring board 40 is disposed at both sides of the printed wiring board 40 on the sheet material 10, and these coupon boards 50 are cut out from the sheet material 10 together with the printed wiring board 40.

Figure 4:
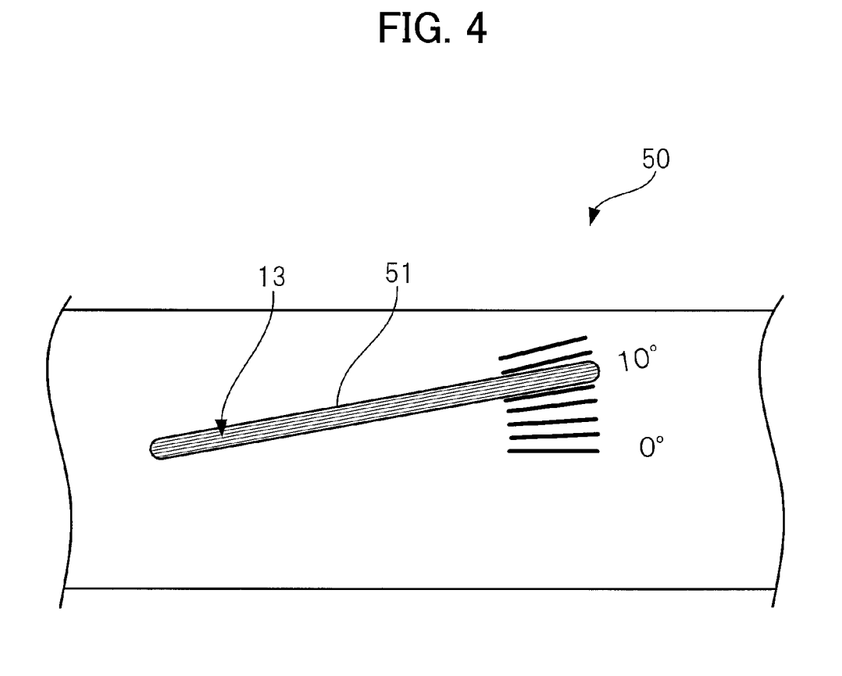
FIG. 4 is a view illustrating part of a coupon board of two coupon boards 50 illustrated in FIG. 3.

FIG. 4 is a view illustrating a part of one coupon board of the two coupon boards 50 illustrated in FIG. 3.

In FIG. 4, the coupon board 50 is long in the lateral direction, and in a part of the coupon board 50, the long window 51 with the solder resist film on the surface being removed, and the angle of the long window 51 from the longitudinal direction of the coupon board 50 are illustrated. In the example illustrated here, the long window 51 extends in the direction of an angle of 10° with respect to the longitudinal direction of the coupon board 50. Inside the long window 51, the glass fibers 13 extending in the longitudinal direction of the long window 51 is visually recognized.

In this case, the printed wiring board 40 and the coupon board 50 illustrated in FIG. 3 are cut out at an inclination of 10° with respect to the sheet material 10. When the cutting is accurately performed, the glass fibers 13 extending in the longitudinal direction of the long window 51 are visually recognized in the long window 51 illustrated in FIG. 4. Thereby, it is easily inspected that the printed wiring board 40 is cut at a correct angle.

Figure 5:
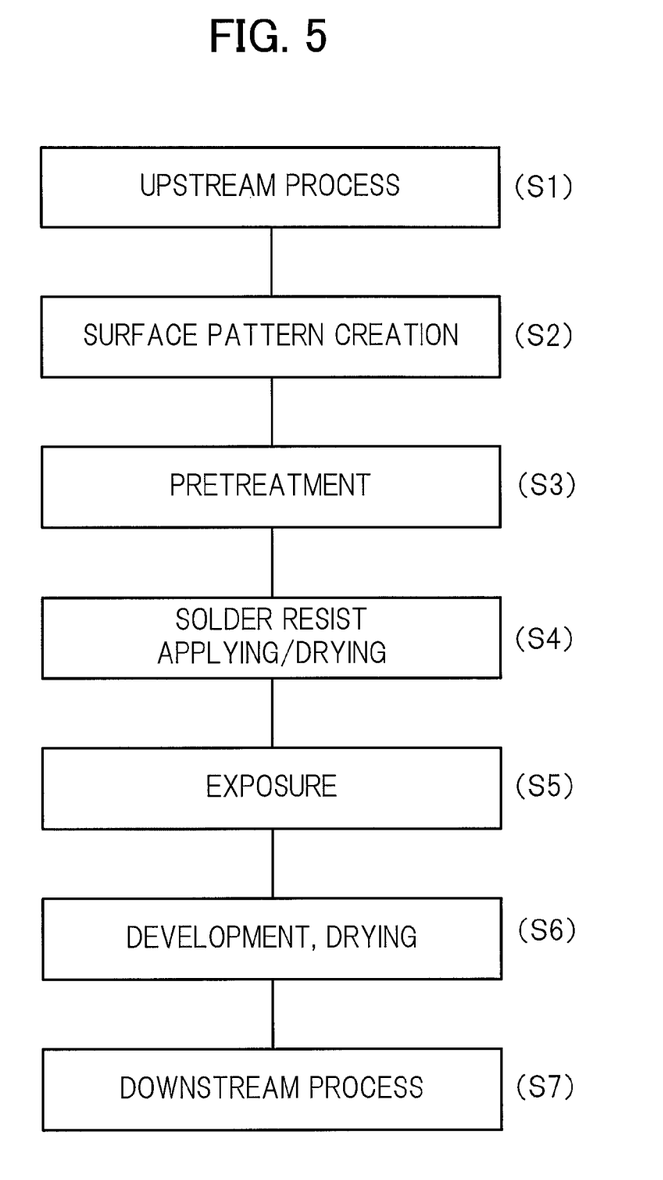
FIG. 5 is a flow chart illustrating a method for forming a window in which a solder resist is removed.

FIG. 5 is a flow chart illustrating a method for forming the window in which the solder resist is removed.

In this case, in an upstream process (step S1), a sheet (prepreg and a copper clad sheet) in which glass fibers extending vertically and laterally are impregnated with a resin such as an epoxy resin and embedded is prepared first. By going through the process steps of formation of a wiring pattern of an inner layer, thermo-compression bonding, boring, plating and the like, the sheet material 10 (see FIGS. 1 and 3) in the state without a wiring pattern on the surface is produced. Next, a wiring pattern is formed on the surface of the sheet material (step S2), and pretreatment such as cleaning and polishing is performed (step S3). Thereafter, a solder resist is applied onto the surface of the sheet material 10 and is dried (step S4). The solder resist film has the characteristic of being cured by light irradiation. Therefore, the solder resist film is exposed next (step S5). In the exposure, only the region on which the solder resist film is desired to be left on the surface of the sheet material 10 is irradiated with light, and the portion where the electronic components are soldered, the windows 31 and 51 on the coupon boards 30 and 50 and the like are not irradiate with the light. Thereafter, the flow goes through the development process step of melting the portions which are not subjected to light irradiation, of the solder resist film, and the subsequent dry process step (step S6). In a downstream process (step S7), a gold plating treatment to the portions where the solder resist film is removed of the wiring and the like are performed, and in the subsequent process, cutting of the printed wiring board and the coupon board is performed.

Steps S1 to S7 illustrated in FIG. 5 are necessary steps irrespective of whether or not to form the window for visually recognizing glass fibers in the coupon board, and as for the change, only the exposure pattern is changed for formation of the window. Thus, the window for visually confirming the glass fibers may be formed without increasing the cost.

In this case, as the shape of the window, two examples of FIGS. 2 and 4 are described, but any windows other than those in these examples may be adopted as long as the embedded glass fibers may be visually recognized. Further, in this case, the windows are formed by removing the solder resist films, but the windows may be covered with transparent protection films.

Further, in this case, the sheet material before the printed wiring board and the coupon board are cut out is described as having the glass fibers extending vertically and laterally embedded therein. However, the glass fibers may be embedded to extend obliquely in the manufacture process of the sheet material, and at the time of cutting, the printed wiring board and the coupon board may be cut out so as to have sides parallel with the sides of the sheet material. In such a case, the directions of the fibers embedded in the printed wiring may be confirmed by forming the window for visually recognizing the fibers in the coupon board.

The coupon board is cut out together with the printed wiring board from the sheet material to be the basis of cutting of the printed wiring board. At the time of the cutting, the geometrical arrangement position and orientation of the coupon board are uniquely determined with respect to the printed wiring board. Consequently, according to the coupon board disclosed in the present invention and the manufacturing method of the printed wiring board disclosed in the present invention, the orientation of the fibers in the printed wiring board may be easily confirmed by visually recognizing the orientation of the fibers in the coupon board from the window provided in the coupon board.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has(have) been described in detail, it should be understood that the various changes, substitutions, and alterations could be made hereto without departing from the spirit and scope of the invention.

What is claimed is:

1. A coupon board that is cut out as part of a printed wiring board from a sheet material for evaluating characteristics of the printed wiring board, comprising:
   a solder resist film formed on a surface of the printed wiring board and coupon board cut out from the sheet material, wherein the sheet material comprises a glass cloth fiber and resin;
   a region of the coupon board on which the solder resist film is not formed, wherein visual recognition of the orientation of the glass cloth fiber in the coupon board is not hindered, and which region extends parallel with one side of the printed wiring board, wherein the orientation of the weave of the glass cloth fibers in the coupon board is the same as the orientation of the weave of the glass cloth fibers in the printed wiring board, and
   wherein the printed wiring board and the coupon board are cut out of the sheet material as a single piece.

2. The coupon board according to claim 1, wherein the region is formed by removing the solder resist film on the surface.

3. A coupon board that is cut out as part of a printed wiring board from a sheet material for evaluating characteristics of the printed wiring board, comprising:
   a solder resist film formed on a surface of the printed wiring board and coupon board cut out from the sheet material, wherein the sheet material comprises a glass cloth fiber and resin;
   a region of the coupon board on which the solder resist film is not formed on the surface, and which region extends parallel with the orientation of the weave of the glass cloth fiber; and wherein the orientation of the weave of the glass cloth fibers in the coupon board is the same as the orientation of the weave of the glass cloth fibers in the printed wiring board, and
   an angle table in which an angle indicating an angle with respect to a direction in which one side of the printed wiring board extends is printed.

4. The coupon board according to claim 3, wherein the region is formed by removing the solder resist film on the surface of the printed wiring board.

5. A manufacturing method for a printed wiring board having a coupon board, comprising:
   forming a solder resist film on a surface of the printed wiring board and the coupon board cut out as a single unit from a sheet material, wherein the sheet material comprises a glass cloth fiber and resin; wherein a part of a portion of the printed wiring board comprising the coupon board is not covered by the solder resist film; and wherein the region comprising the part of the portion of the printed wiring board comprising the coupon board is not a region for cutting the printed wiring board
   cutting off the coupon board for evaluating characteristics of the printed wiring board, in a region including a region where the solder resist film is not formed and in which visual recognition of the glass cloth fiber is not hindered, together with the printed wiring board.

6. The manufacturing method of a printed wiring board according to claim 5,
   wherein the solder resist film is formed by removing, after forming a solder resist film on the surface of the glass cloth fiber, the solder resist film on the part of the portion which is not a region for cutting the printed wiring board.

7. The manufacturing method of a printed wiring board according to claim 5,
   wherein a region extending parallel with one side of the printed wiring board is the region where the solder resist film is not formed.

8. The manufacturing method of a printed wiring board according to claim 6,
   wherein a region extending parallel with one side of the printed wiring board is the region where the solder resist film is not formed.

9. The manufacturing method of the printed wiring board according to claim 5,
   wherein at a time of formation of the solder resist film, an angle indicating an angle with respect to a direction in which the side extends is printed in the region for cutting the coupon board.

10. The manufacturing method of the printed wiring board according to claim 6,
    wherein at a time of formation of the solder resist film, an angle indicating an angle with respect to a direction in which the side extends is printed in the region for cutting the coupon board.

11. The manufacturing method of the printed wiring board according to claim 7, wherein at a time of formation of the solder resist film, an angle indicating an angle with respect to a direction in which the side extends is printed in the region for cutting the coupon board.

12. The manufacturing method of the printed wiring board according to claim 8,
wherein at a time of formation of the solder resist film, an angle indicating an angle with respect to a direction in which the side extends is printed in the region for cutting the coupon board.

* * * * *